United States Patent
Choi et al.

(10) Patent No.: US 11,476,433 B2
(45) Date of Patent: Oct. 18, 2022

(54) LIGHT EMITTING DEVICE INCLUDING A QUANTUM DOT LIGHT EMITTING LAYER HAVING A FIRST AND SECOND LIGAND ON A SURFACE OF A QUANTUM DOT

(71) Applicant: ELECTRONICS AND TELECOMMUNICATIONS RESEARCH INSTITUTE, Daejeon (KR)

(72) Inventors: Sukyung Choi, Daejeon (KR); Hyunkoo Lee, Daejeon (KR); Byoung-Hwa Kwon, Daejeon (KR); Jaehyun Moon, Daejeon (KR); Hyunsu Cho, Daejeon (KR); Chan-mo Kang, Daejeon (KR); Chunwon Byun, Daejeon (KR); Jin Wook Shin, Daejeon (KR); Nam Sung Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 257 days.

(21) Appl. No.: 16/839,857

(22) Filed: Apr. 3, 2020

(65) Prior Publication Data
US 2021/0066631 A1    Mar. 4, 2021

(30) Foreign Application Priority Data
Aug. 29, 2019  (KR) ................. 10-2019-0106369

(51) Int. Cl.
*H01L 29/06*    (2006.01)
*H01L 51/50*    (2006.01)
(Continued)

(52) U.S. Cl.
CPC ............ *H01L 51/502* (2013.01); *C09K 11/06* (2013.01); *H01L 51/0003* (2013.01);
(Continued)

(58) Field of Classification Search
CPC ............ H01L 51/5056; H01L 51/5072; H01L 51/0035; H01L 51/0037; H01L 51/0061; H01L 51/0072; G09K 2211/1029
(Continued)

(56) References Cited

U.S. PATENT DOCUMENTS

2009/0296766 A1    12/2009  Kim et al.
2013/0104986 A1    5/2013   Jung et al.
(Continued)

FOREIGN PATENT DOCUMENTS

| KR | 10-1794082 B1 | 11/2017 |
| KR | 10-1877469 B1 | 7/2018 |
| KR | 10-1878341 B1 | 7/2018 |

OTHER PUBLICATIONS

Sukyung Choi et al., "Partially pyridine-functionalized quantum dots for efficient red, green, and blue light-emitting diodes", Journal of Materials Chemistry C, vol. 7, No. 12, pp. 3429-3435, Mar. 28, 2019.

*Primary Examiner* — Phuc T Dang
(74) *Attorney, Agent, or Firm* — Rabin & Berdo, P.C.

(57) ABSTRACT

Provided is a light emitting device including a lower electrode, an upper electrode disposed to face the lower electrode, a quantum dot light emitting layer between the lower electrode and the upper electrode, an electron transport layer between the lower electrode and the quantum dot light emitting layer, and a hole transport layer between the upper electrode and the quantum dot light emitting layer, wherein the quantum dot light emitting layer includes a quantum dot, and a first ligand on a surface of the quantum dot, and a second ligand on the surface of the quantum dot.

9 Claims, 18 Drawing Sheets

(51) Int. Cl.
  *H01L 51/00* (2006.01)
  *H01L 51/56* (2006.01)
  *C09K 11/06* (2006.01)

(52) U.S. Cl.
  CPC ...... *H01L 51/5056* (2013.01); *H01L 51/5072* (2013.01); *H01L 51/56* (2013.01); *C09K 2211/1029* (2013.01); *H01L 51/0035* (2013.01); *H01L 51/0037* (2013.01); *H01L 51/0061* (2013.01); *H01L 51/0072* (2013.01); *H01L 2251/303* (2013.01)

(58) Field of Classification Search
  USPC .......................................................... 257/13
  See application file for complete search history.

(56) References Cited

U.S. PATENT DOCUMENTS

| | | | |
|---|---|---|---|
| 2017/0352827 A1 | 12/2017 | Cho et al. | |
| 2018/0346748 A1* | 12/2018 | Pan | C09K 11/06 |
| 2019/0123292 A1* | 4/2019 | Woo | H01L 51/5072 |
| 2019/0276734 A1* | 9/2019 | Kim | H01L 27/3244 |

* cited by examiner

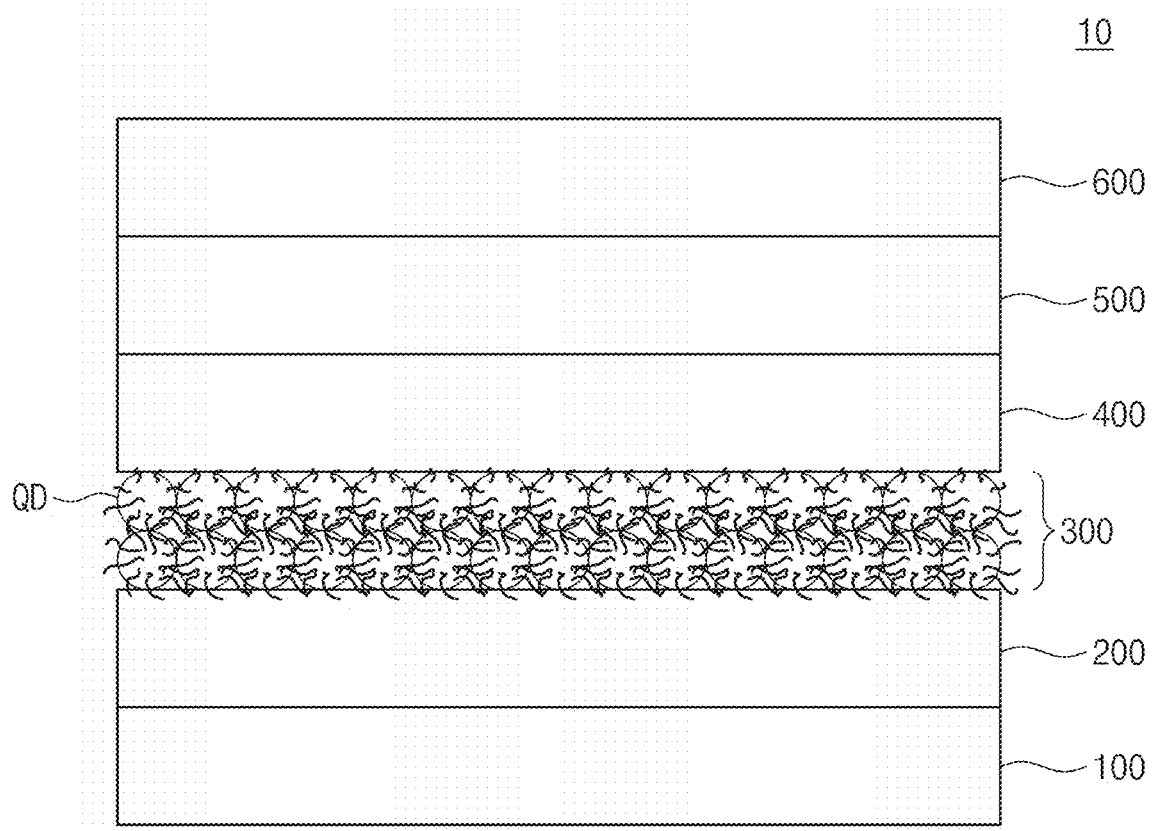

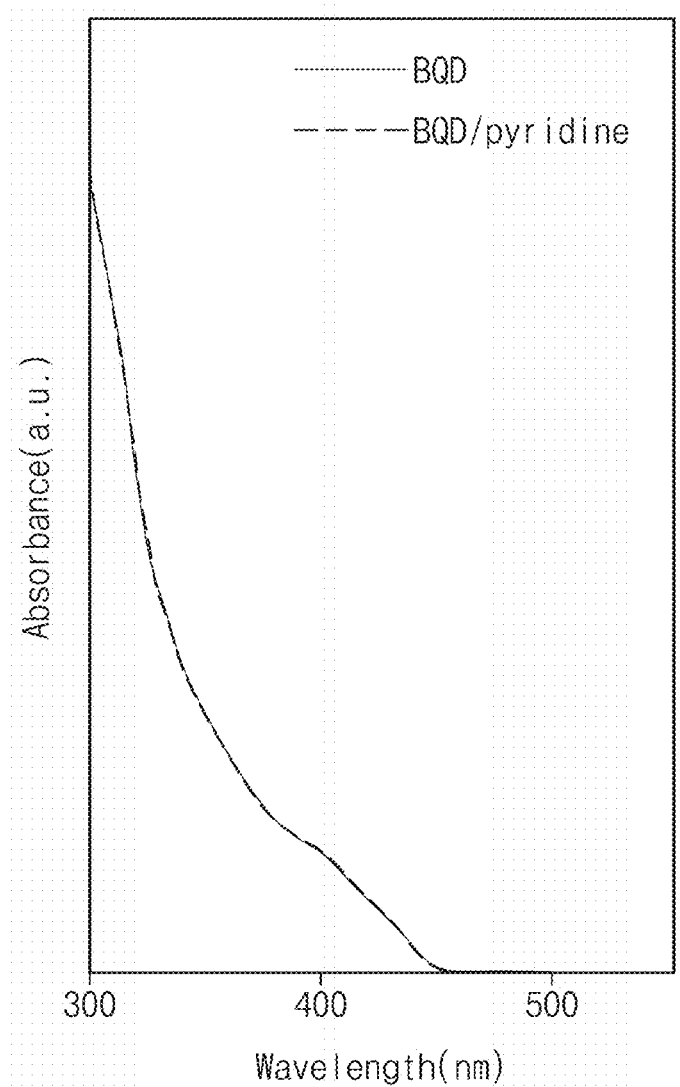

FIG. 9
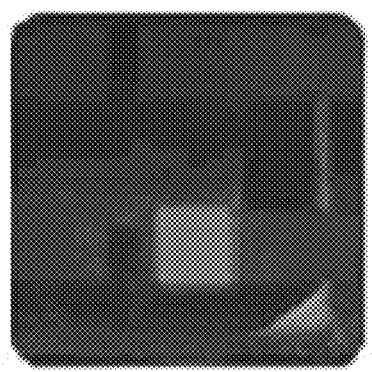
RQD
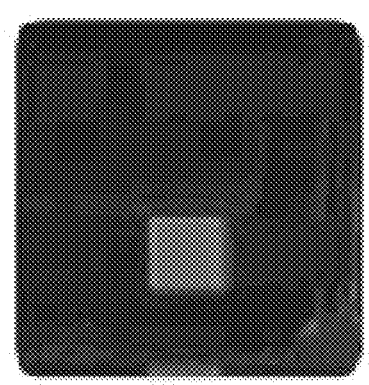
GQD
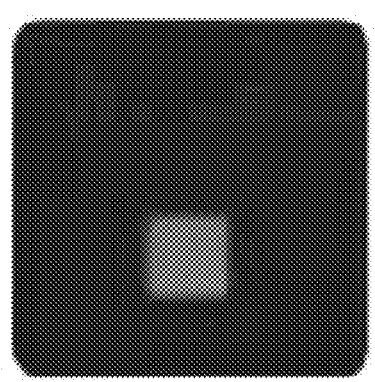
BQD
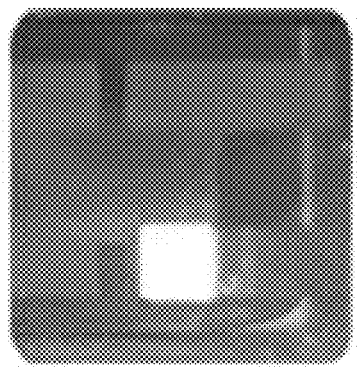
RQD/pyridine
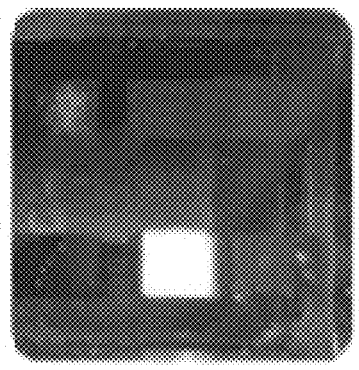
GQD/pyridine
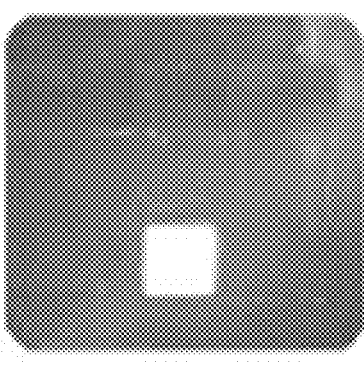
BQD/pyridine

LIGHT EMITTING DEVICE INCLUDING A QUANTUM DOT LIGHT EMITTING LAYER HAVING A FIRST AND SECOND LIGAND ON A SURFACE OF A QUANTUM DOT

CROSS-REFERENCE TO RELATED APPLICATIONS

This U.S. non-provisional patent application claims priority under 35 U.S.C. § 119 of Korean Patent Application No. 10-2019-0106369, filed on Aug. 29, 2019, the entire contents of which are hereby incorporated by reference.

BACKGROUND

The present disclosure herein relates to a light emitting device and a manufacturing method thereof.

Recently, there is a growing demand for a high color reproduction display capable of faithfully reproducing colors close to nature. Thus, interest in quantum dot light emitting devices as a next generation display device having good color reproducibility is increasing.

A quantum dot light emitting device refers to a device which emits light by itself upon combination of electrons and holes injected from both electrodes of a light emitting layer including quantum dots. In order to secure the performance and sufficient lifetime of the light emitting device, the electrons and holes in the light emitting layer should be balanced. However, although electrons are readily movable inside the light emitting device, holes having a large energy level difference unlike electrons may not be readily injected into the light emitting layer, thereby causing an electron-hole imbalance issue in the light emitting layer. Accordingly, researches to solve such an electron-hole imbalance phenomenon in the light emitting layer have been actively conducted.

SUMMARY

The present disclosure provides a quantum dot light emitting device having an improved electron-hole imbalance phenomenon.

The present disclosure also provides a method for manufacturing a quantum dot light emitting device having an improved electron-hole imbalance phenomenon.

An embodiment of the inventive concept provides a quantum dot light emitting device including a lower electrode, an upper electrode disposed to face the lower electrode, a quantum dot light emitting layer between the lower electrode and the upper electrode, an electron transport layer between the lower electrode and the quantum dot light emitting layer, and a hole transport layer between the upper electrode and the quantum dot light emitting layer, wherein the quantum dot light emitting layer includes a quantum dot, and a first ligand on a surface of the quantum dot, and a second ligand on the surface of the quantum dot, the first ligand is adjacent to the electron transport layer, the first ligand is an organic compound having a chain structure, the second ligand is adjacent to the hole transport layer, the second ligand is an organic compound having a ring structure, and a length of the second ligand may be shorter than a length of the first ligand.

In an embodiment, the second ligand may be pyridine.

In an embodiment, the quantum dot light emitting layer may have a multilayer structure in which quantum dots are stacked.

In an embodiment, the second ligand may be disposed at an interface between the quantum dot light emitting layer and the hole transport layer.

In an embodiment, the quantum dot may include Group II-VI, Group III-V, or Group I-III-VI nano-semiconductor compounds.

In an embodiment, the quantum dot may include cadmium selenide (CdSe), cadmium sulfide (CdS), cadmium telluride (CdTe), zinc sulfide (ZnS), zinc selenide (ZnSe), zinc telluride (ZnTe), indium phosphide (InP), indium arsenide (InAs), copper indium sulfide ($CuInS_2$), copper indium selenide ($CuInSe_2$), or a mixture thereof.

In an embodiment, the electron transport layer may include zinc oxide (ZnO), titanium dioxide ($TiO_2$), tungsten trioxide ($WO_3$), or a mixture thereof.

In an embodiment, the hole transport layer may include poly(9,9-dioctylfluorene-alt-N-(4-sec-butylphenyl)-diphenylamine) (TFB), 4,4',4"-tris(carbazol-9-yl)triphenylamine (TCTA), N,N'-di(1-naphthyl)-N,N'-diphenyl-(1,1'-biphenyl)-4,4'-diamine (NPB), poly[N,N'-bis(4-butylphenyl)-N,N'-bisphenylbenzidine](Poly-TPD), 4,4'-bis (9-carbazolyl)-1,1'-biphenyl (CBP), or a mixture thereof.

In an embodiment, a hole injection layer between the hole transport layer and the upper electrode is included, and the hole injection layer may include $MoO_3$, poly(3,4-ethylenedioxythiophene):polystyrene sulfonate (PEDOT:PSS), or a mixture thereof.

In an embodiment of the inventive concept, a method for manufacturing a light emitting device includes forming an electron transport layer on a lower electrode, synthesizing a quantum dot a surface of which first ligands bind to, providing the synthesized quantum dot on the electron transport layer to form a quantum dot emitting layer, substituting at least one of the first ligands of the quantum dot of the quantum dot light emitting layer with a second ligand, forming a hole transport layer on the quantum dot light emitting layer, and forming an upper electrode on the hole transport layer.

In an embodiment, forming a hole injection layer between the hole transport layer and the upper electrode may be further included.

In an embodiment, each of the first ligands is an organic compound having a chain structure, the second ligand is an organic compound having a ring structure, and a length of the second ligand may be shorter than a length of the first ligand.

In an embodiment, the second ligand may be pyridine.

In an embodiment, the quantum dot light emitting layer may have a multilayer structure in which quantum dots are stacked.

In an embodiment, the second ligand may be disposed at an interface between the quantum dot light emitting layer and the hole transport layer.

In an embodiment, the substituting at least one of the first ligands of the quantum dot of the quantum dot light emitting layer with the second ligand may be performed through a spin coating process, a spray coating process, a bar coating process or a dipping process.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 1 is a cross-sectional view of a quantum dot light emitting device according to embodiments of the inventive concept;

FIGS. 7A to 7C are graphs showing absorption spectra in the ultraviolet-visible light region of quantum dot light emitting devices manufactured according to Example and Comparative Example;

FIG. 9 shows comparison results of brightness of quantum dot light emitting devices manufactured according to Example and Comparative Example;

DETAILED DESCRIPTION

Figure 2A:
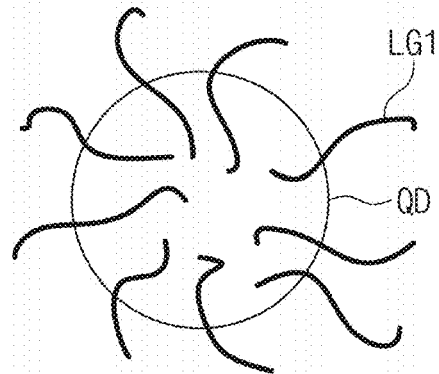
FIGS. 2A to 2C are conceptual views illustrating a quantum dots according to embodiments of the inventive concept.

In order to help fully understand the configuration and effects of the present disclosure, preferred embodiments of the present disclosure will be explained with reference to the accompanying drawings. However, the present disclosure should not be construed as limited to the embodiments set forth herein and may be embodied in different forms and various changes can be made. These embodiments are provided so that this disclosure will be thorough and complete, and will fully convey the scope of the invention to those skilled in the art.

In the specification, it will be understood that when an element is referred to as being "on" another element, it can be directly on the other element or intervening elements may be present. Also, in the drawings, the thickness of elements is exaggerated for an effective description of technical contents. Like numbers refer to like elements throughout.

It will be understood that, although the terms "first", "second", etc. may be used herein to describe various elements, these elements should not be limited by these terms. These terms are only used to distinguish one element from another. Embodiments described and exemplified herein include complementary embodiments thereof.

The terms used in the present disclosure are for explaining the exemplary embodiments rather than limiting the present disclosure. Unless particularly stated otherwise in the present specification, a singular form also includes a plural form. The meaning of "comprises" and/or "comprising" used in this specification does not exclude the existence or addition of one or more other elements in addition to the mentioned elements.

FIG. 1 is a cross-sectional view of a quantum dot light emitting device 10 according to embodiments of the inventive concept.

Referring to FIG. 1, a quantum dot light emitting device 10 including a lower electrode 100, an electron transport layer 200, a quantum dot light emitting layer 300, a hole transport layer 400, a hole injection layer 500, and an upper electrode 600 may be provided.

The lower electrode 100 may be provided on a substrate (not shown) and may include a transparent conductive material. For example, the lower electrode 100 may include a transparent conductive oxide (TCO) thin film (e.g., an indium tin oxide (ITO) thin film or an indium zinc oxide (IZO) thin film), a conductive organic thin film (e.g., a thin film including at least one of copper iodide, polyaniline, poly(3-methylthiophene), or pyrrole), or a graphene thin film. In exemplary embodiments, the lower electrode 100 may be formed by a thermal deposition process, a chemical vapor deposition (CVD) process, or an atomic layer deposition (ALD) process.

The electron transport layer 200 may be formed on the lower electrode 100. The electron transport layer 200 may stably supply electrons to the quantum dot light emitting layer 300. The electron transport layer 200 may include a material having high electron mobility, and may include, for example, zinc oxide (ZnO), titanium dioxide (TiO$_2$), tungsten trioxide (WO$_3$), or a mixture thereof.

The quantum dot light emitting layer 300 may be formed on the electron transport layer 200. The quantum dot light emitting layer 300 is a light emitting layer including quantum dots QD, and electrons and holes injected from both electrodes may combine to generate light. The quantum dot light emitting layer 300 may generate light of a first color, a second color, a third color, or white color, and for example, the first to third colors may be red, green, and blue.

The quantum dot light emitting layer 300 may include nano-sized quantum dots QD having a diameter of about 1 to about 100 nm, and for example, the quantum dots QD may include Group II-VI, Group III-V, or Group I-III-VI nano-semiconductor compounds. For example, the quantum dots QD may include cadmium selenide (CdSe), cadmium sulfide (CdS), cadmium telluride (CdTe), zinc sulfide (ZnS), zinc selenide (ZnSe), zinc telluride (ZnTe), indium phosphide (InP), indium arsenide (InAs), copper indium sulfide (CuInS$_2$), copper indium selenide (CuInSe$_2$), or a mixture thereof.

The quantum dot QD according to an embodiment of the inventive concept may be synthesized by heating a precursor solution in a vacuum state. The precursor solution may include a first precursor solution and a second precursor solution. For example, the first precursor solution may be a Cd precursor solution and the second precursor solution may be a Se precursor solution. The first precursor solution and the second precursor solution may react with each other to generate CdSe quantum dots. As another example, the first precursor solution may be a Cd precursor solution and the second precursor solution may be a S precursor solution. The first precursor solution and the second precursor solution may react with each other to generate CdS quantum dots.

The synthesis temperature of the quantum dot QD is not particularly limited, but may be, for example, about 90° C. to about 350° C.

The precursor solution may further include an organic compound capable of providing a ligand on the surface of the quantum dot QD. While the quantum dot is formed, the organic compound may bind to the surface of the quantum dot as its surface ligand. The type of the organic compound is not particularly limited, and may include, for example, oleic acid, trioctylphosphine, trioctylphosphine-oxide, oleylamine or a mixture thereof. Residual organic compounds that do not bind to the quantum dots QD may be removed using an anti-solvent. The anti-solvent may include methanol or acetone.

The quantum dots QD may be coated on the electron transport layer 200 through a solution process, and the ligand may bind to the surface of the quantum dot QD to uniformly disperse the quantum dots QD in a solvent used in the solution process. The ligand binding to the surface of the quantum dot QD may have a functional group, and the functional group may have a specific charge. Electrical attraction or repulsion generated by the ligand having a charged functional group may affect the charge mobility and energy level of the quantum dot light emitting layer 300.

The hole transport layer 400 may be formed on the quantum dot light emitting layer 300. The hole transport layer 400 may provide holes to the quantum dot light emitting layer 300. For example, the hole transport layer 400 may include poly(9,9-dioctylfluorene-alt-N-(4-sec-butylphenyl)-diphenylamine) (TFB), 4,4', 4"-tris(carbazol-9-yl)triphenylamine (TCTA), N,N'-Di(1-naphthyl)-N, N'-diphenyl-(1,1'-biphenyl)-4,4'-diamine (NPB), poly[N,N'-bis (4-butylphenyl)-N,N'-bisphenylbenzidine] (Poly-TPD), 4,4'-bis(9-carbazolyl)-1,1'-biphenyl (CBP), or a mixture thereof.

The hole injection layer 500 may be formed on an upper part of the hole transport layer 400. The hole injection layer 500 may facilitate the hole injection into the hole transport layer 400 to reduce the driving current and the driving voltage of the light emitting device. For example, the hole injection layer 500 may include $MoO_3$, poly(3,4-ethylenedioxythiophene) polystyrene sulfonate (PEDOT:PSS), or a mixture thereof.

The upper electrode 600 may be formed on the hole injection layer 500. The upper electrode 600 may include a conductive material having a lower work function than the lower electrode 100. For example, the upper electrode 600 may include aluminum (Al), gold (Au), silver (Ag), iridium (Ir), molybdenum (Mo), palladium (Pd), platinum (Pt), or a combination thereof. In exemplary embodiments, the upper electrode 600 may be formed by a deposition process. In exemplary embodiments, the upper electrode 600 may be formed by a thermal evaporation process, a chemical vapor deposition process, or an atomic layer deposition process.

Figure 2B:
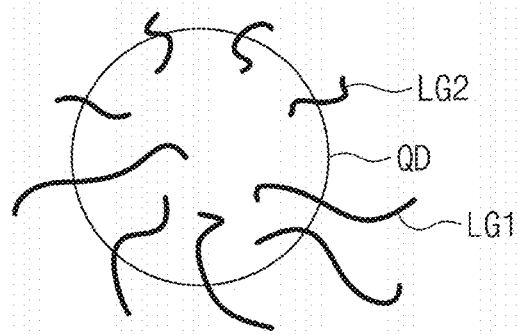
Figure 2C:
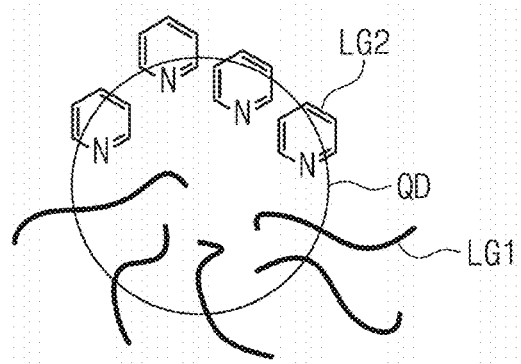

FIGS. 2A to 2C are conceptual views illustrating a quantum dot QD according to embodiments of the inventive concept.

Referring to FIG. 2A, at least one first ligand LG1 may bind to the surface of the quantum dot QD. The first ligand LG1 may be an organic compound having a chain structure, and may include, for example, oleic acid, trioctylphosphine, trioctylphosphine oxide, oleylamine or a mixture thereof.

Referring to FIG. 2B, at least one first ligand LG1 and at least one second ligand LG2 may bind to the surface of the quantum dot QD. The first ligand LG1 and the second ligand LG2 may have different structures from each other. The length of the second ligand LG2 may be shorter than the length of the first ligand LG1. For example, each of the first ligand LG1 and the second ligand LG2 may be an organic compound having a chain structure. The chain length of the second ligand LG2 may be shorter than the chain length of the first ligand LG1.

Referring to FIG. 2C, at least one first ligand LG1 and at least one second ligand LG2 may bind to the surface of the quantum dot QD. The first ligand LG1 and the second ligand LG2 may have different structures from each other. The length of the second ligand LG2 may be shorter than the length of the first ligand LG1. For example, the first ligand LG1 may be an organic compound having a chain structure, and the second ligand LG2 may be an organic compound having a ring structure. For example, the second ligand LG2 may include pyridine.

Figure 3A:
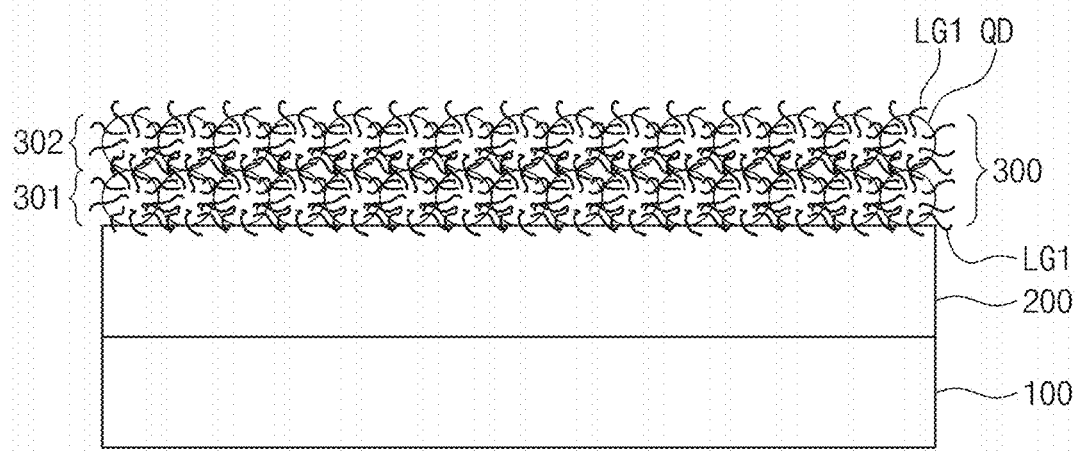
FIGS. 3A to 3C are cross-sectional views of quantum dot light emitting devices according to embodiments of the inventive concept.
Figure 3B:
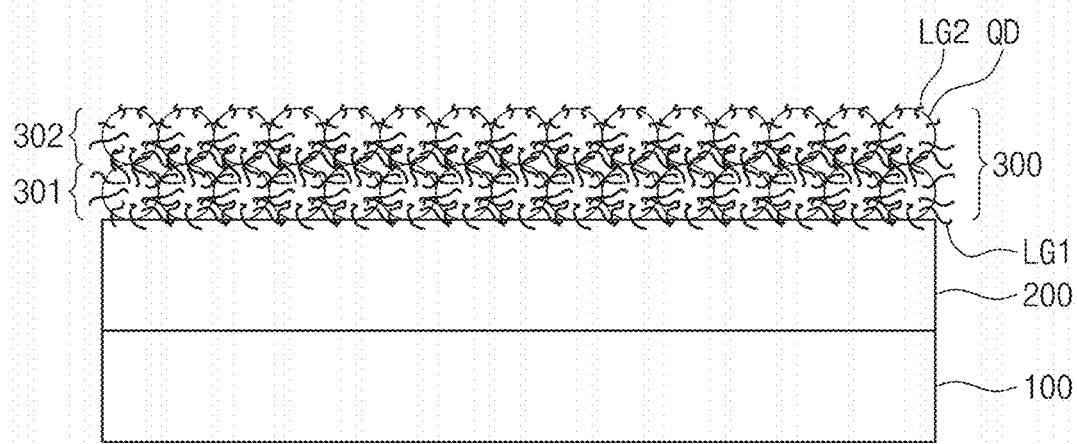
Figure 3C:
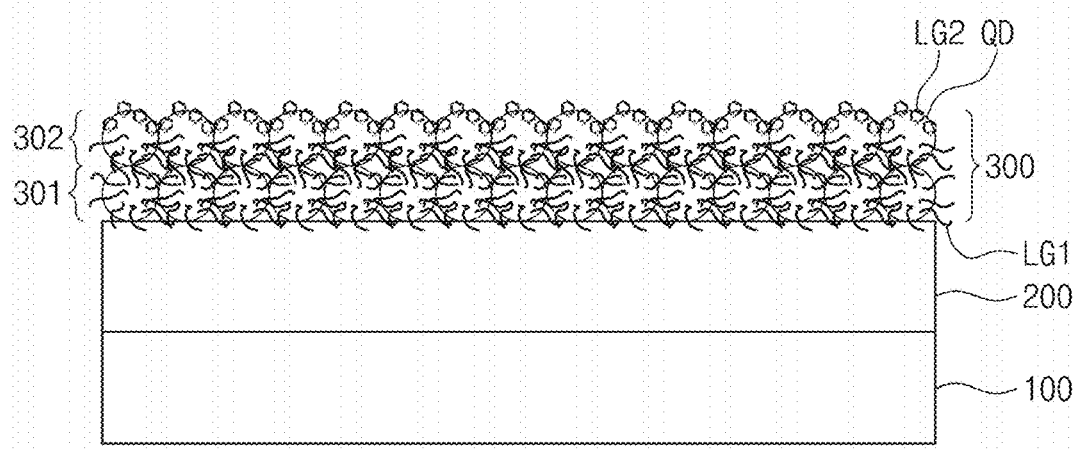

FIGS. 3A to 3C are cross-sectional views illustrating quantum dot light emitting devices according to embodiments of the inventive concept. Hereinafter, duplicate descriptions as those described with reference to FIGS. 2A to 2C will be omitted.

Referring to FIGS. 3A to 3C, the quantum dot light emitting layer 300 may have a multilayer structure in which quantum dots QD are stacked. As illustrated in FIGS. 3A to 3C, the quantum dot light emitting layer 300 may have a layered structure in which a first quantum dot layer 301 and a second quantum dot layer 302 are stacked in order on the electron transport layer 200.

As illustrated in FIG. 3B or 3C, at least one of the first ligands LG1 binding to the surface of the quantum dot QD may be substituted with a second ligand LG2 having a different structure from that of the first ligand LG1. As illustrated in FIG. 3B, at least one of the first ligands LG1 binding to the surface of the second quantum dot layer 302 may be substituted with the second ligand LG2, and the length of the second ligand LG2 may be shorter than the length of the first ligand LG1. As illustrated in FIG. 3C, at least one of the first ligands LG1 binding to the surface of the second quantum dot layer 302 may be substituted with the second ligand LG2, and the second ligand LG2 may be pyridine. The substitution process is not particularly limited, and may be performed through, for example, a spin coating process, a spray coating process, a bar coating process or a dipping process.

The first ligand LG1 binding to the first quantum dot layer 301 is adjacent to the electron transport layer 200, and the second ligand LG2 binding to the second quantum dot layer 302 may be adjacent to a hole transport layer (see a hole transport layer 400 of FIG. 1). When the length of the second ligand LG2 adjacent to the hole transport layer is shorter than the length of the first ligand LG1 adjacent to the electron transport layer 200, the hole transfer from the hole transport layer to the quantum dot light emitting layer 300 may be readily performed. As a result, the hole-electron imbalance phenomenon in the quantum dot light emitting layer 300 may be alleviated. The second ligand LG2 may be disposed at an interface between the quantum dot light emitting layer 300 and the hole transport layer.

Example—Manufacture of Quantum Dot Light Emitting Devices

In an embodiment of the inventive concept, a quantum dot light emitting device corresponding to a visible light region was manufactured using cadmium (Cd)-based red, green, and blue light emitting quantum dots. Indium tin oxide (ITO) was deposited and patterned on a glass substrate to form a negative electrode, and an electron transport layer was formed on the negative electrode through spin coating using zinc oxide (ZnO) nanoparticles. A light emitting layer was formed on the electron transport layer by spin coating using a quantum dot solution. In terms of the quantum dot solution, the quantum dot particles contained organic ligands (oleic acid and trioctylphosphine) at the time of synthesis, were thus used by being dispersed in an organic solvent (toluene and octane).

After forming the quantum dot light emitting layer, the pyridine solution was dropped onto the quantum dot light emitting layer in order to substitute a ligand on the quantum dot light emitting layer, and then the existing ligand exposed to the upper end of the quantum dot was substituted with pyridine through spin coating. After the pyridine solution treatment, methanol was used to remove the substituted ligand and the unsubstituted pyridine. As a result, a quantum dot light emitting layer in which only the upper part of the quantum dot light emitting layer was selectively substituted with a pyridine ligand was manufactured. Thereafter, a hole transport layer (TCTA), a hole injection layer ($MoO_3$), and an upper electrode (Ag) were deposited on the quantum dot light emitting layer in order through a thermal evaporation process to manufacture a quantum dot light emitting device at the end.

Comparative Example—Manufacture of Quantum Dot Light Emitting Devices

A quantum dot light emitting device according to Comparative Example was manufactured in the same manner as the manufacturing method of the quantum dot light emitting device in Example above. However, the step of substituting a ligand on the quantum dot light emitting layer with pyridine was not performed.

Figure 4A:
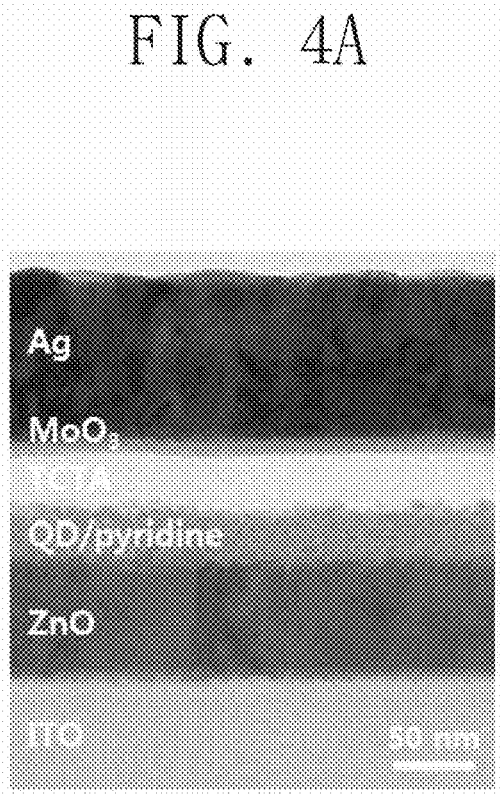
FIGS. 4A and 4B show images obtained by observing cross sections of quantum dot light emitting devices manufactured according to Example and Comparative Example using a transmission electron microscope.
Figure 4B:
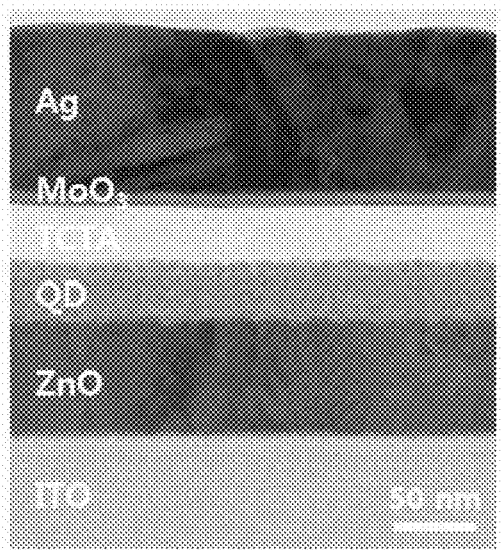

FIGS. 4A and 4B show images obtained by observing cross sections of quantum dot light emitting devices manufactured according to Example and Comparative Example respectively, using a transmission electron microscope.

Figure 5:
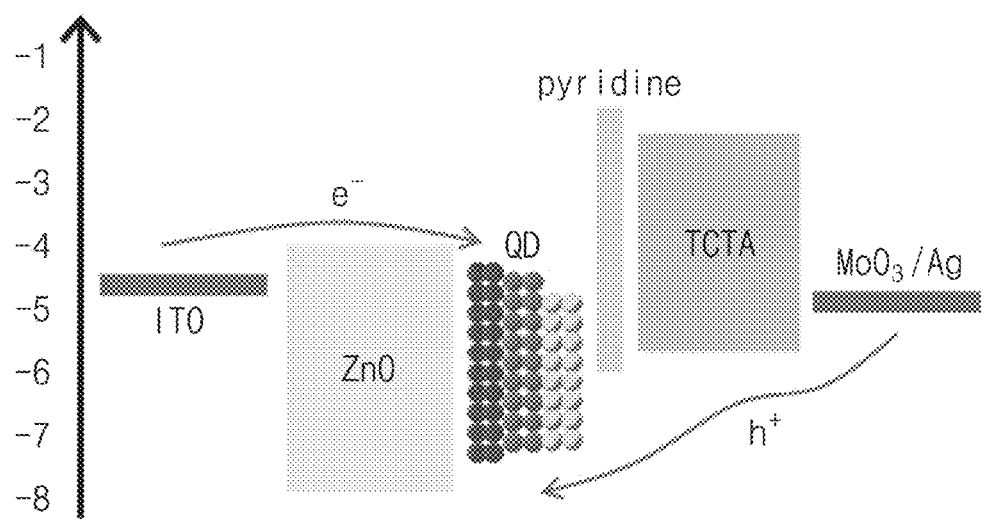
FIG. 5 is a view illustrating an energy level of a quantum dot light emitting device according to embodiments of the inventive concept.

FIG. 5 is a view illustrating an energy level of a quantum dot light emitting device manufactured according to an embodiment. It could be confirmed that when the surface of the quantum dot QD includes pyridine as a second ligand LG2 (see FIG. 2C), the highest occupied molecular orbital (HOMO) level of the pyridine is positioned halfway between the valence band of the quantum dot and the HOMO level of TCTA to generate a cascade energy form. The result indicates that the substituted short pyridine ligand not only reduces the distance between the quantum dot light emitting layer and the hole transport layer, but also forms an intermediate energy level between the quantum dot and the hole transport layer so that holes are readily transferred, thereby improving the inefficient hole injection issue in the quantum dot light emitting device.

Experimental Example 1—Observation of Optical Properties Changes of Quantum Dots According to Example and Comparative Example The optical properties of the quantum dot in the quantum dot light emitting devices manufactured according to Example and Comparative Example were observed. The transmittance in the infrared region was measured.

Figure 6:
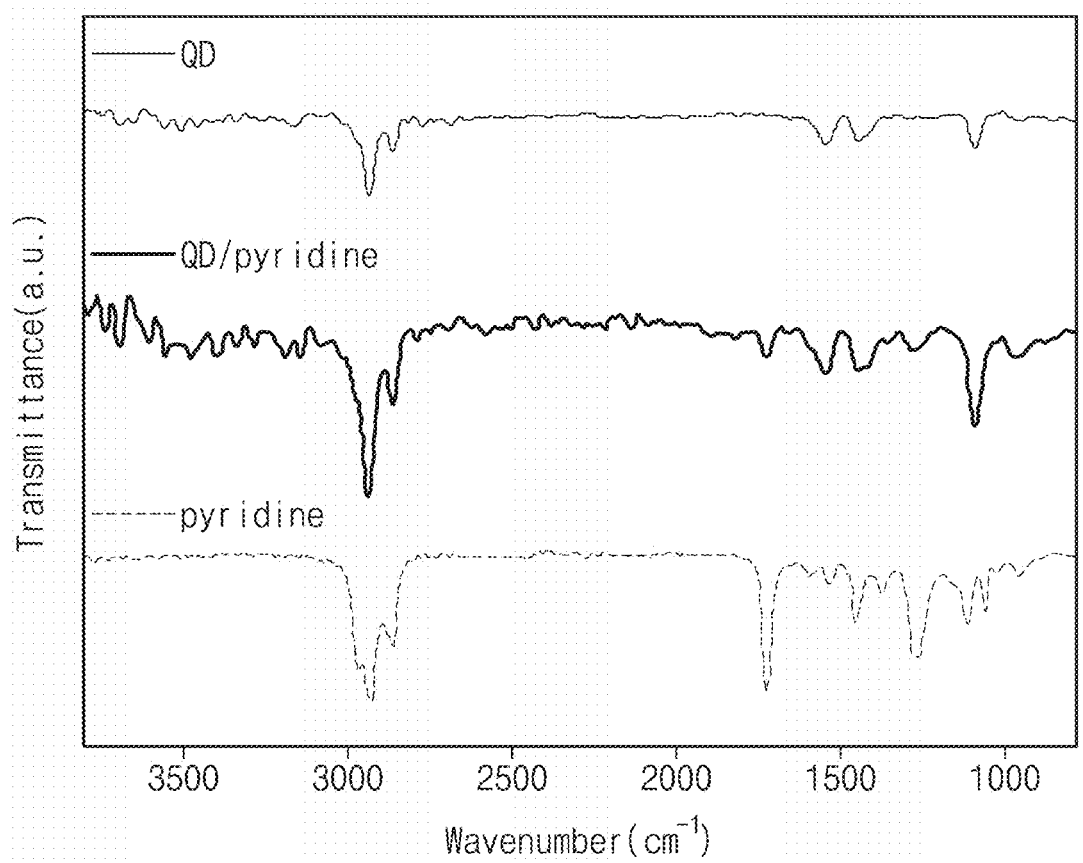
FIG. 6 is a graph showing the transmittances in the infrared region of quantum dot light emitting devices manufactured according to Example and Comparative Example.

FIG. 6 is a graph showing the results obtained by measuring the transmittance in the infrared region of the quantum dot light emitting devices manufactured according to Example and Comparative Example using a Fourier transform infrared (FTIR) spectroscope. As illustrated in FIG. 6, in the quantum dot in the quantum dot light emitting device manufactured according to the Comparative Example, C=N stretch peak (1731 $cm^{-1}$) due to pyridine was not observed in the spectrum. On the other hand, the C=N stretch peak (1731 $cm^{-1}$) was observed in the quantum dot light emitting device manufactured according to the Example to demonstrate that pyridine exists on the surface of the quantum dot.

Figure 7A:
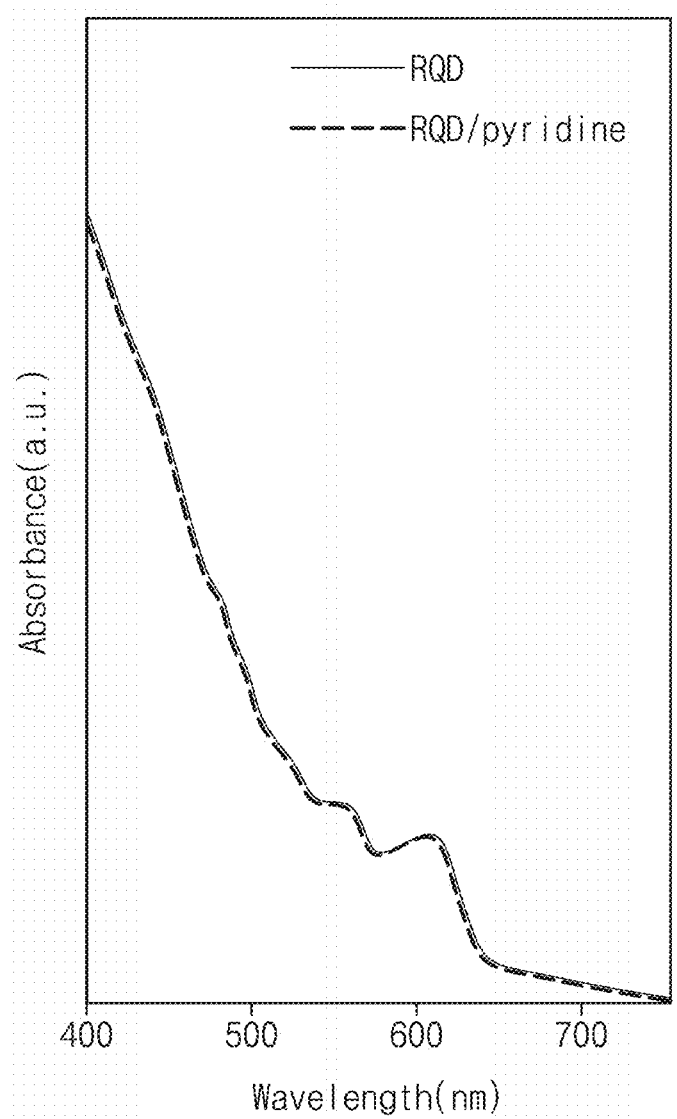
Figure 7B:
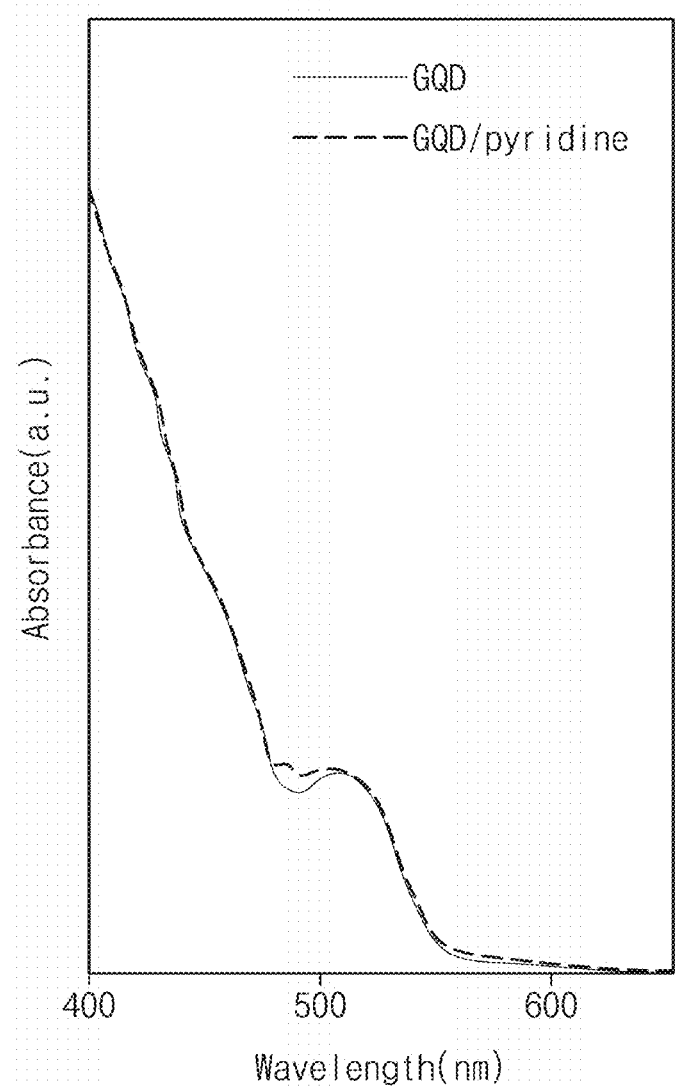

FIGS. 7A to 7C are graphs showing an absorption spectrum in the ultraviolet-visible light region of quantum dot light emitting devices manufactured according to Example and Comparative Example. As illustrated in FIGS. 7A to 7C, it could be confirmed that red, green, and blue quantum dots RQD/pyridine, GQD/pyridine, and BQD/pyridine substituted with pyridine maintain the inherent absorbance characteristics of the quantum dots.

Experimental Example 2—Evaluation of Luminance, Current Efficiency, and Power Efficiency of Quantum Dot Light Emitting Devices According to Example and Comparative Example In order to examine the effects of the quantum dot light emitting device manufactured according to the inventive concept, the current density, luminance, current efficiency, and power efficiency of the quantum dot light emitting devices manufactured according to Example and Comparative Example were compared and analyzed.

FIGS. 8A to 8F are graphs showing measurement results of current density, luminance, current efficiency, and power efficiency of red, green, and blue quantum dots manufactured according to Example and Comparative Example.

Figure 8A:
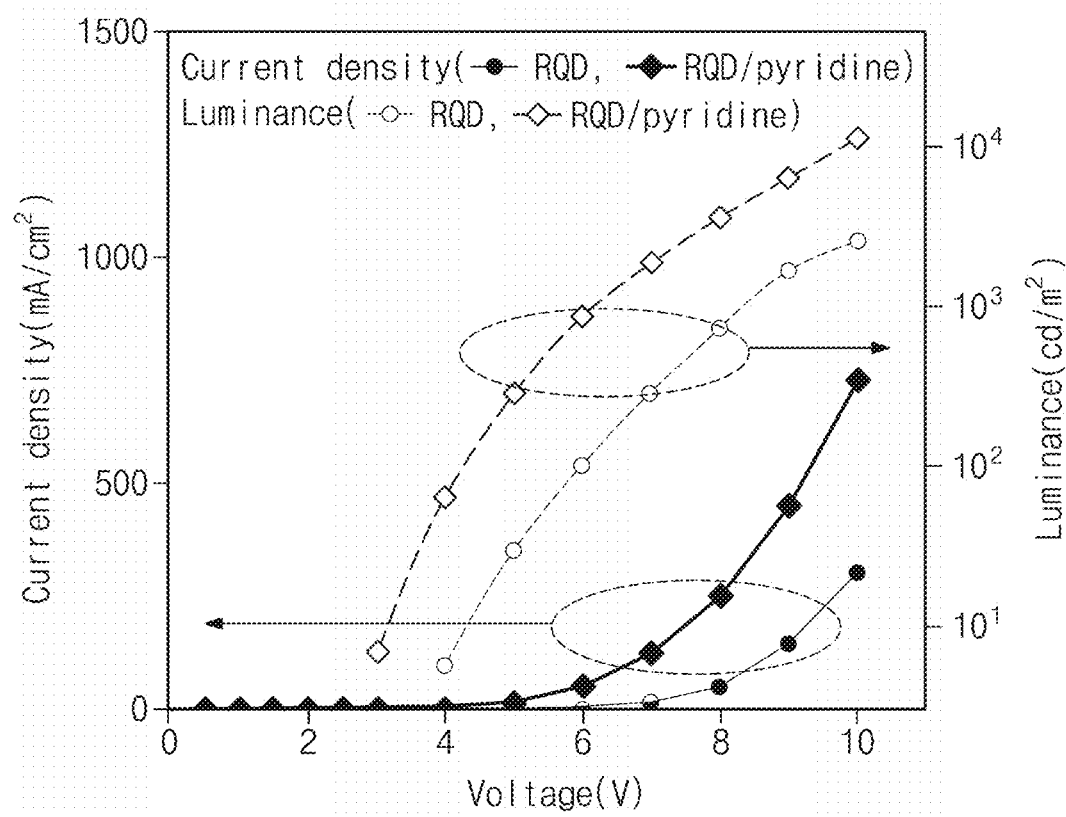
FIGS. 8A to 8F are graphs showing current density, luminance, current efficiency, and power efficiency of quantum dot light emitting devices manufactured according to Example and Comparative Example.
Figure 8B:
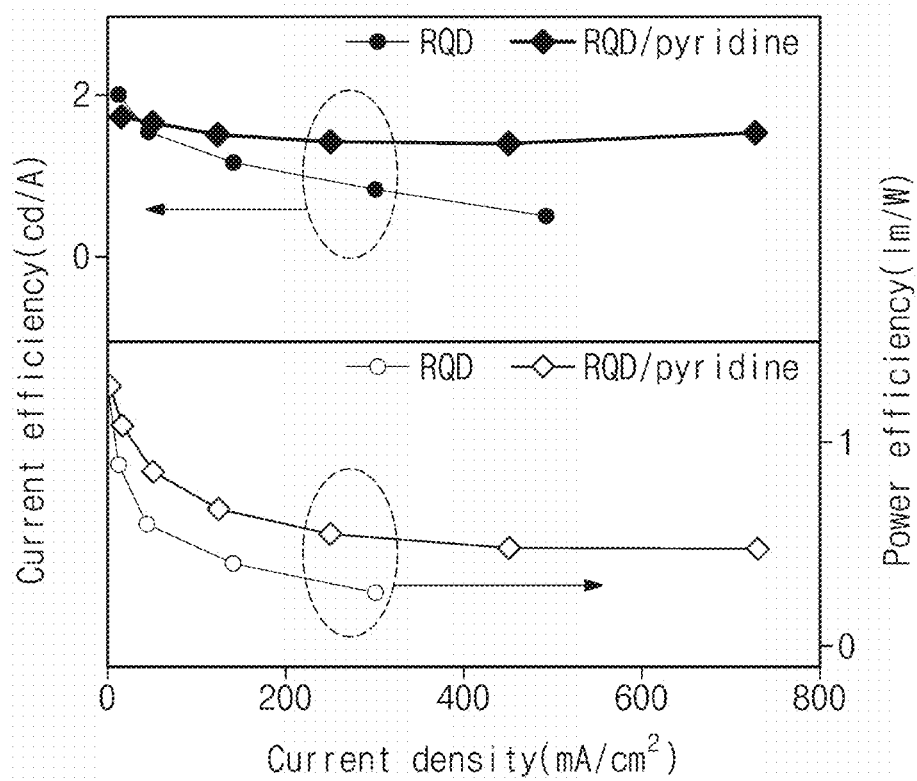
Figure 8C:
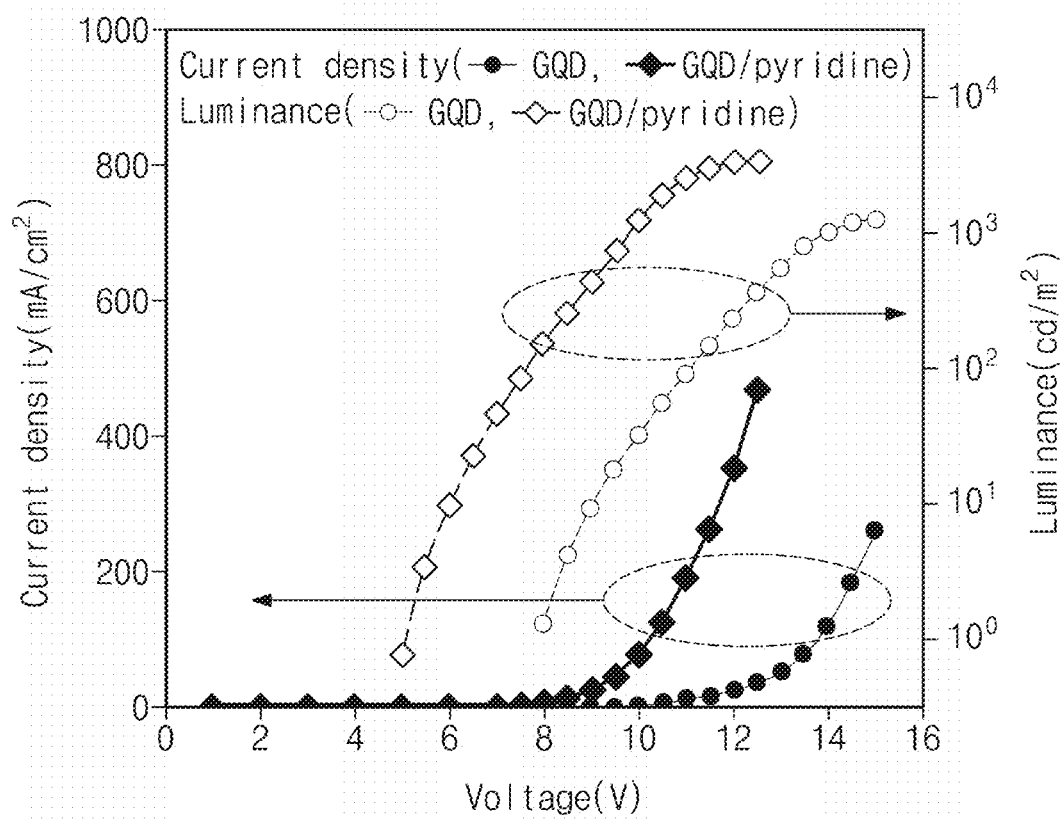
Figure 8D:
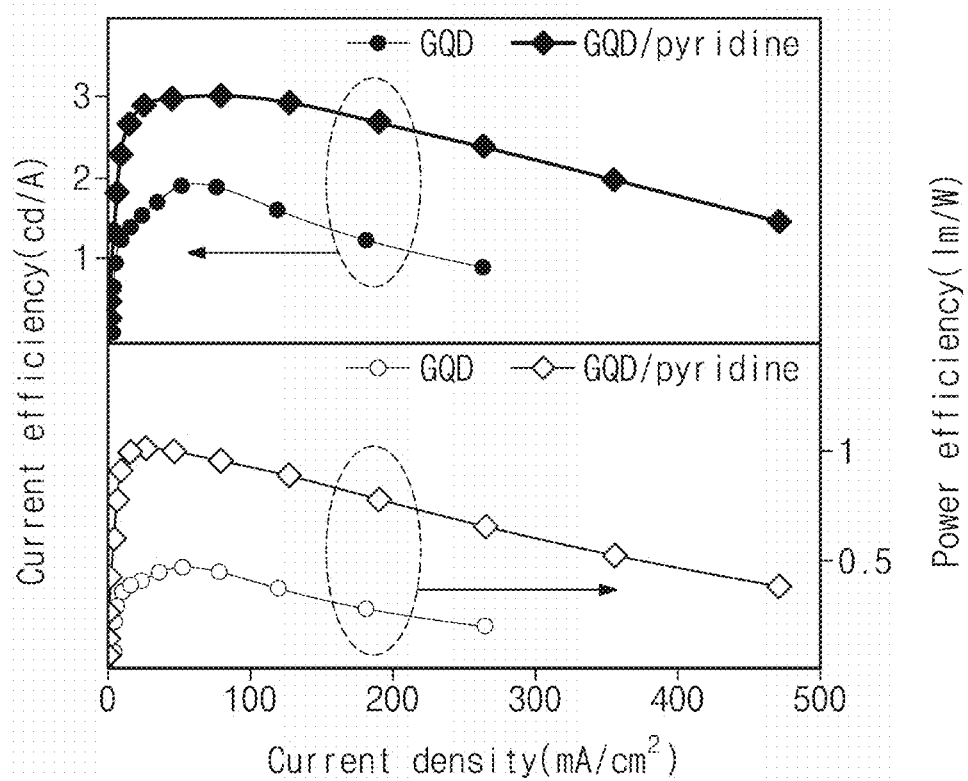
Figure 8E:
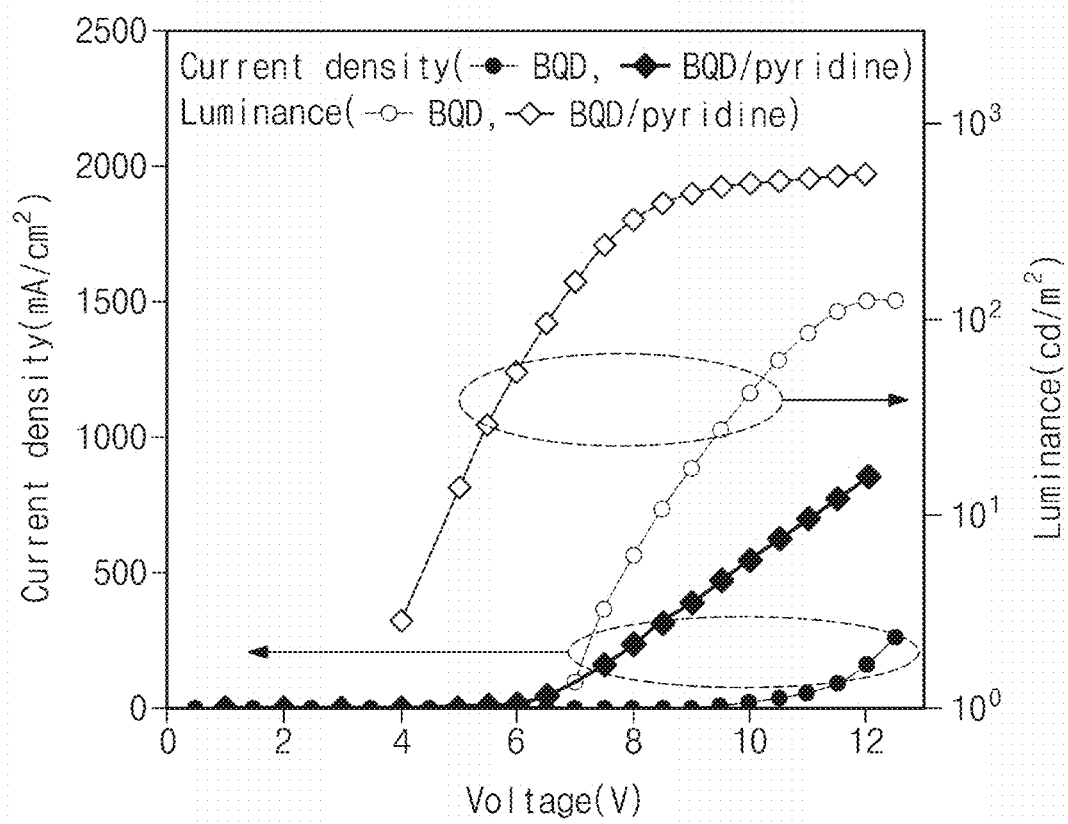

As illustrated in FIGS. 8A, 8C, and 8E, in red, green, and blue quantum dot light emitting devices (RQD/pyridine, GQD/pyridine, and BQD/pyridine) manufactured according to Example, it could be confirmed that turn-on voltage was pulled, and the luminance also increased compared to the red, green, and blue quantum dot light emitting devices RQD, GQD, and BQD manufactured according to Comparative Example.

Figure 8F:
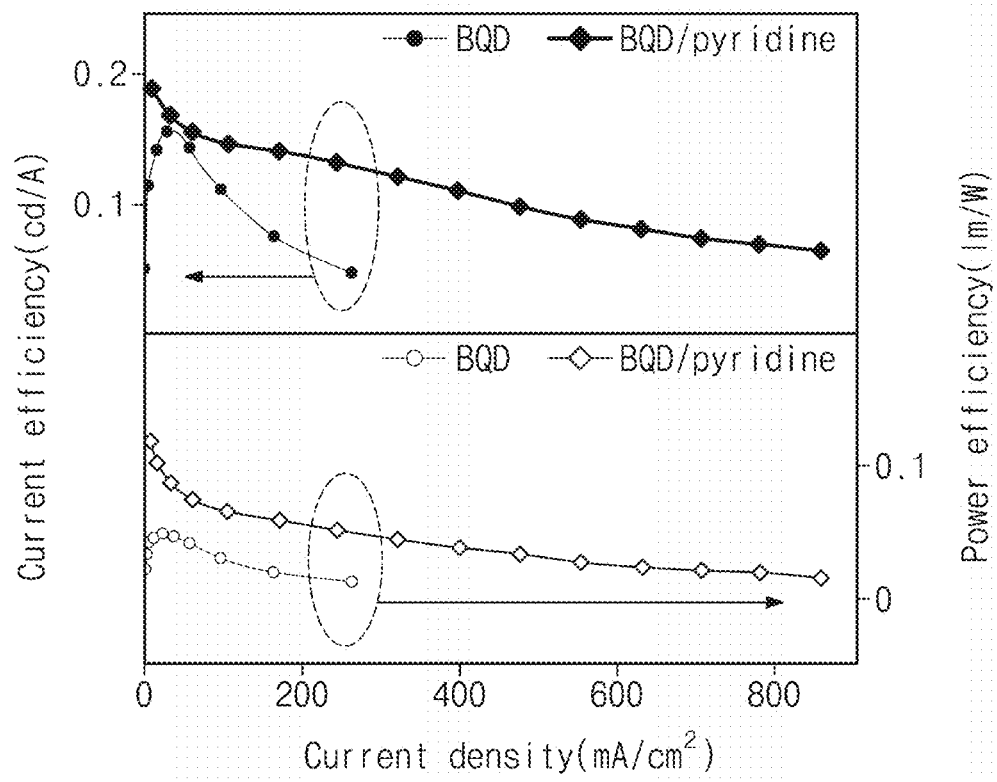

As illustrated in FIGS. 8B, 8D, and 8F, when observing the current efficiency and power efficiency of the quantum dot light emitting devices, it could be confirmed that the current efficiency and power efficiency of the red, green, and blue quantum dot light emitting devices (RQD/pyridine, GQD/pyridine, and BQD/pyridine) manufactured according to the Example were superior to those of the red, green, and blue quantum dot light emitting devices (RQD, GQD, and BQD) manufactured according to the Comparative Example. As a result, it could be confirmed that regardless of the emission color and the quantum dot energy level, the quantum dot substituted with pyridine manufactured according to the Example facilitates the hole movement in the quantum dot light emitting device, thereby improving the performance of the quantum dot light emitting device.

Experimental Example 3—Evaluation of Brightness, Electroluminescence (EL) Spectrum and Color Coordinates of Quantum Dot Light Emitting Devices According to Example and Comparative Example In order to examine the effects of the quantum dot light emitting devices manufactured according to the inventive concept, the brightness and EL spectrum of the quantum dot light emitting devices manufactured according to Example and Comparative Example were compared and the color coordinates were evaluated.

As illustrated in FIG. 9, it is confirmed that the red, green, and blue quantum dot light emitting devices (RQD/pyridine, GQD/pyridine, and BQD/pyridine) manufactured according to Example emit much brighter light than the red, green, and blue quantum dot light emitting didoes (RQD, GQD, and BQD) manufactured according to Comparative Example under the same voltage.

Figure 10:
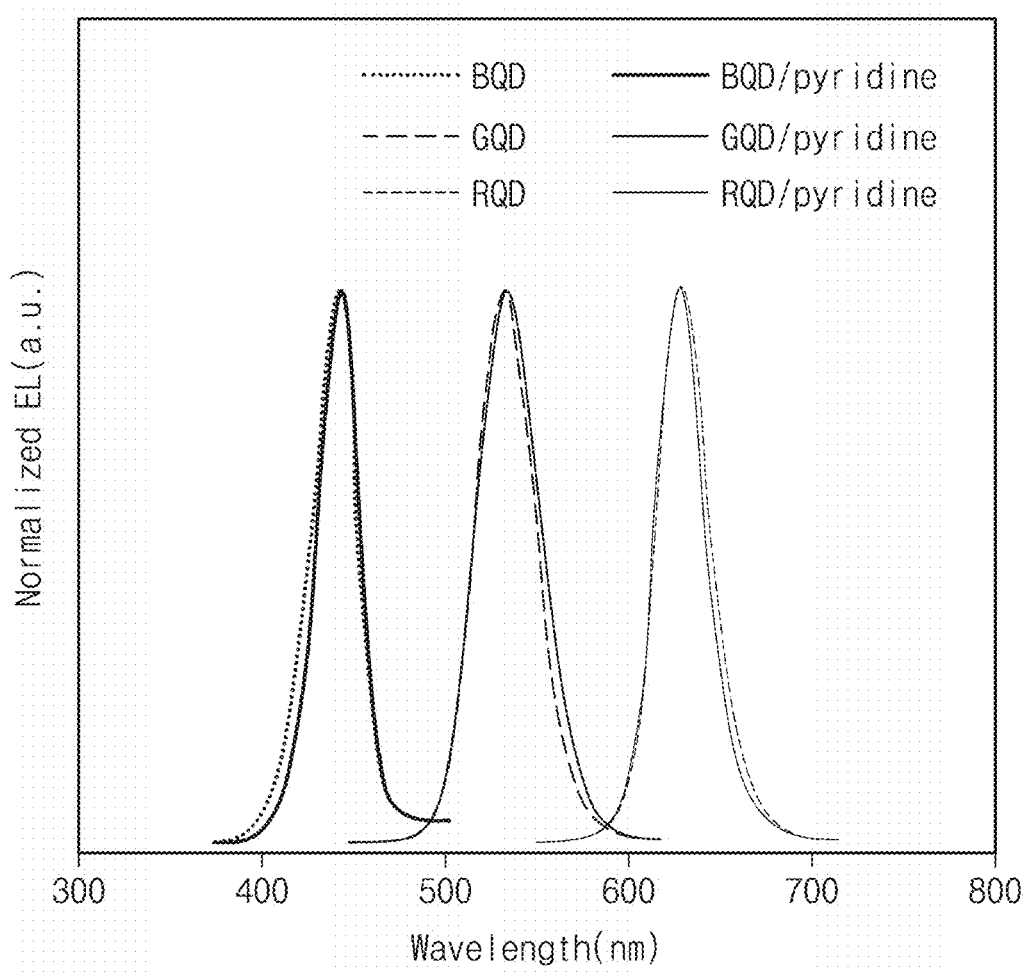
FIG. 10 is a graph showing electroluminescence spectra of quantum dot light emitting devices manufactured according to Example and Comparative Example.

As illustrated in FIG. 10, when comparing the electroluminescence (EL) spectrum of red, green, and blue quantum dot light emitting devices (RQD/pyridine, GQD/pyridine, and BQD/pyridine) manufactured according to Example and red, green, and blue quantum dot light emitting devices (RQD, GQD, and BQD) manufactured according to Comparative Example, it could be confirmed that even if the surface of the quantum dot was substituted with pyridine, the emission characteristic of the quantum dot itself was not affected and full width at half maximum (FWHM) was maintained.

Figure 11:
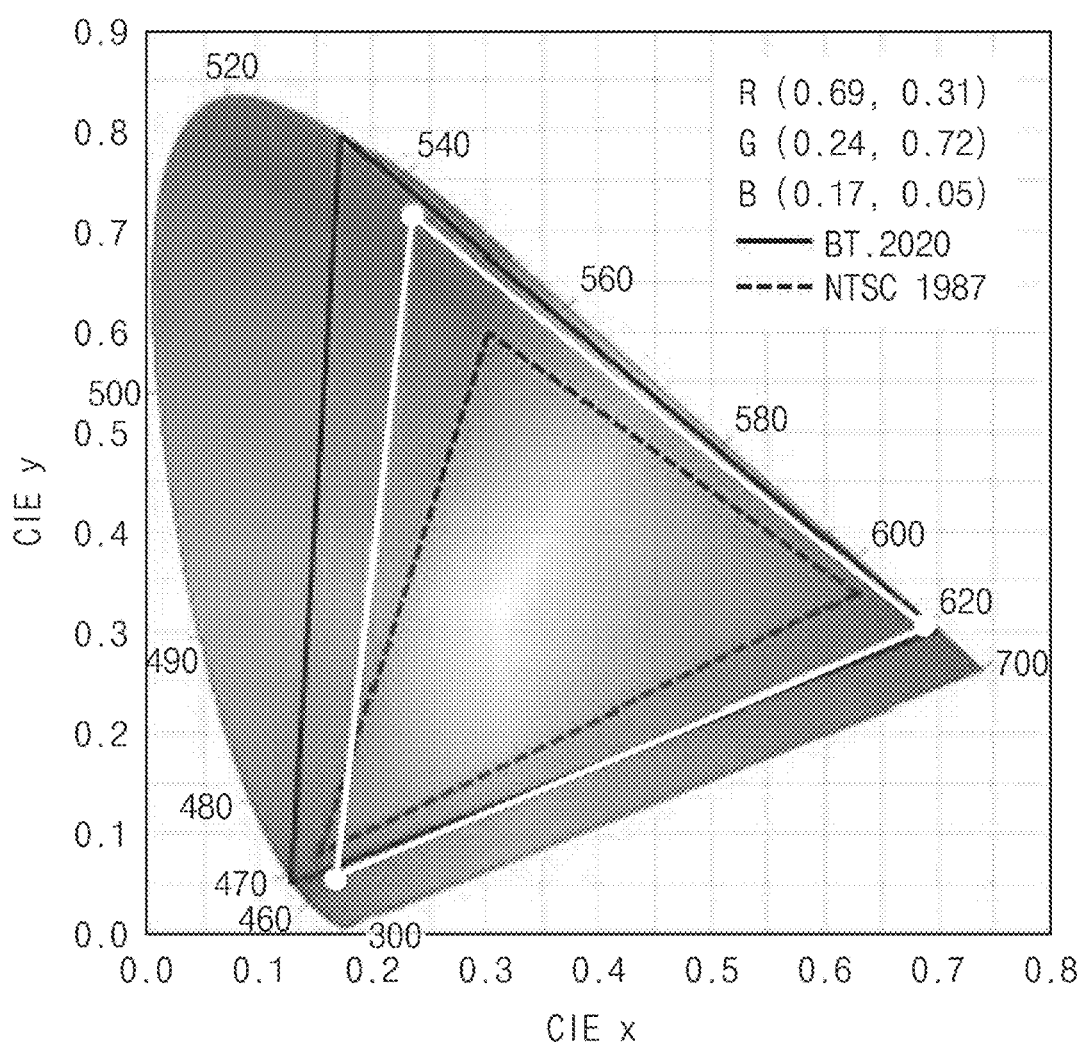
FIG. 11 shows color coordinates of a quantum dot light emitting device manufactured according to an embodiment.

In addition, as illustrated in FIG. 11, as a result of evaluating the color coordinates of the quantum dot light emitting devices manufactured according to Example indicate that the quantum dot light emitting devices are suitable as a high color reproduction light emitting device since a quite large area of 159% of NTSC1987 and 78% of BT2020 is covered.

In a quantum dot light emitting device according to an embodiment of the inventive concept, transferring holes from a hole transport layer to a quantum dot light emitting layer may be readily performed by controlling a ligand on the surface of a quantum dot. Therefore, the electron-hole imbalance phenomenon in the quantum dot light emitting layer may be improved. In addition, the quantum dot light emitting device according to an embodiment of the inventive concept may have improved brightness, current efficiency, and power efficiency.

However, the effects of embodiments of the inventive concept are not limited to the above disclosure.

Although the exemplary embodiments of the present disclosure have been described with reference to the accompanying drawings, it will be understood to those skilled in the art that the present invention may be implemented in different specific forms without changing the technical ideals or essential features. Accordingly, it should be understood that the embodiments described herein are illustrative not restrictive in all aspects.

What is claimed is:

1. A light emitting device, comprising:
   a lower electrode;
   an upper electrode disposed to face the lower electrode;
   a quantum dot light emitting layer between the lower electrode and the upper electrode;
   an electron transport layer between the lower electrode and the quantum dot light emitting layer; and
   a hole transport layer between the upper electrode and the quantum dot light emitting layer,
   wherein the quantum dot light emitting layer comprises:
   a first quantum dot layer adjacent to the electron transport layer;
   a first ligand binding to the first quantum dot layer;
   a second quantum dot layer adjacent to the hole transport layer; and
   a second ligand binding to the second quantum dot layer, and
   wherein the first ligand is an organic compound having a chain structure,
   the second ligand is an organic compound having a ring structure,
   a length of the second ligand is shorter than a length of the first ligand, and
   the second ligand binding to the second quantum dot layer is adjacent to the hole transport layer.

2. The light emitting device of claim 1, wherein the second ligand is pyridine.

3. The light emitting device of claim 1, wherein a surface of the second quantum dot layer is adjacent to the hole transport layer and an opposite surface of the second quantum dot layer is adjacent to the first quantum dot layer, and
   wherein the second ligand binds to the surface of the second quantum dot layer and the first ligand binds to the opposite surface of the second quantum dot layer.

4. The light emitting device of claim 1, wherein the second ligand is disposed at an interface between the second quantum dot layer and the hole transport layer, and the first ligand is disposed at an interface between the first quantum dot layer and the second quantum dot layer and between the first quantum dot layer and the electron transport layer.

5. The light emitting device of claim 1, wherein quantum dots in each of the first and second quantum dot layers comprises Group II-VI, Group III-V, or Group I-III-VI nano-semiconductor compounds.

6. The light emitting device of claim 1, wherein quantum dots in each of the first and second quantum dot layers comprises cadmium selenide (CdSe), cadmium sulfide (CdS), cadmium telluride (CdTe), zinc sulfide (ZnS), zinc selenide (ZnSe), zinc telluride (ZnTe), indium phosphide (InP), indium arsenide (InAs), copper indium sulfide ($CuInS_2$), copper indium selenide ($CuInSe_2$), or a mixture thereof.

7. The light emitting device of claim 1, wherein the electron transport layer comprises zinc oxide (ZnO), titanium dioxide ($TiO_2$), tungsten trioxide ($WO_3$), or a mixture thereof.

8. The light emitting device of claim 1, wherein the hole transport layer comprises poly(9,9-dioctylfluorene-alt-N-(4-sec-butylphenyl)-diphenylamine) (TFB), 4,4',4"-tris(carbazol-9-yl)triphenylamine (TCTA), N,N'-di(1-naphthyl)-N,N'-diphenyl-(1,1'-biphenyl)-4,4'-diamine (NPB), poly[N,N'-bis (4-butylphenyl)-N,N'-bisphenylbenzidine](Poly-TPD), 4,4'-bis (9-carbazolyl)-1,1'-biphenyl (CBP), or a mixture thereof.

9. The light emitting device of claim 1, comprising a hole injection layer between the hole transport layer and the upper electrode,
   wherein the hole injection layer comprises $MoO_3$, poly (3,4-ethylenedioxythiophene):polystyrene sulfonate (PEDOT:PSS), or a mixture thereof.

* * * * *